US005633586A

United States Patent [19]
Finn

[11] Patent Number: 5,633,586
[45] Date of Patent: May 27, 1997

[54] RAPID FAT- OR WATER-SUPPRESSED MULTISLICE MR PULSE SEQUENCE INCLUDING INITIAL PREPULSE

[75] Inventor: J. Paul Finn, Cranbury, N.J.

[73] Assignee: Siemens Medical Systems, Inc., Iselin, N.J.

[21] Appl. No.: 610,103

[22] Filed: Feb. 29, 1996

[51] Int. Cl.[6] .......................... G01R 33/56; G01R 33/48
[52] U.S. Cl. ........................... 324/309; 128/653.3
[58] Field of Search .................... 324/300, 307, 324/309, 318; 128/653.2–653.5

[56] References Cited

U.S. PATENT DOCUMENTS

| | | | |
|---|---|---|---|
| 5,214,382 | 5/1993 | Harms et al. | 324/309 |
| 5,406,203 | 4/1995 | Oh et al. | 324/309 |
| 5,557,202 | 9/1996 | Miyazaki et al. | 324/307 |

*Primary Examiner*—Sandra L. O'Shea
*Assistant Examiner*—Roger C. Phillips
*Attorney, Agent, or Firm*—Mark H. Jay

[57] ABSTRACT

An MR pulse sequence for conducting fat- or water-suppressed multislice MR studies. Saturation prepulses are used less frequently than is conventional practice. Each time at least one saturation prepulse is used to saturate all slices in a group of slices, one line of MR data is acquired from each slice in the group without using any other saturation prepulse.

4 Claims, 2 Drawing Sheets

RAPID FAT- OR WATER-SUPPRESSED MULTISLICE MR PULSE SEQUENCE INCLUDING INITIAL PREPULSE

BACKGROUND OF THE INVENTION

The invention relates to magnetic resonance (MR) imaging, and more particularly relates to MR imaging wherein the signal of a predetermined spectral component (e.g. fat, water) is saturated so as not to contribute to the image. In its most immediate sense, the invention relates to fat- or water-suppressed multislice MR studies, and to multislice MR studies in which the signal from at least one undesired spectral component is to be suppressed.

MR studies can be degraded by artifacts caused by blood flow or by reduced contrast caused by the presence of fat. To avoid such degradations, water- or fat-suppressed studies are carried out by saturating the water or fat signals. When this is done, the water or fat cannot contribute to the MR image. This saturation is in turn carried out by repeatedly using at least one saturation prepulse. The saturation prepulse(s) precede the imaging pulse sequence used to read out one or more lines of MR data.

When doing a fat-suppressed or blood-suppressed MR study of the multislice type, conventional water or fat suppression techniques can so greatly increase the time required to conduct the study that the study cannot properly be carried out. An example of such a study is a dynamic MR study of the liver and pancreas.

In a dynamic MR study of the liver and pancreas, Gd-DTPA is administered to the patient and the liver and pancreas are imaged in an MR scanner to gauge the rate at which the Gd-DTPA passes into the normal tissue and into abnormal regions within the organs. If the study is not conducted quickly, it cannot be conducted at all. There are two reasons for this. First, the Gd-DTPA becomes distributed quickly and discriminatory concentration differences may be lost. Second, a dynamic MR study of the liver and pancreas is best conducted while the patient holds his or her breath; if the patient breathes while the study is going on, respiratory motion will move the liver and the study will be degraded.

The pancreas adjoins the liver and becomes very conspicuous on fat-suppressed imaging. For this reason, an optimized upper abdominal study requires that the fat signal be suppressed. When fat-saturating saturation prepulses are used in a conventional manner, i.e. before acquisition of each line of MR data, a single breath hold lasts only long enough to acquire MR data for e.g. five slices.

The liver is a relatively large organ; perhaps twenty slices of the patient's body are required to completely image it. It would therefore take at least four sequential breath hold periods to conduct a complete MR liver study, and this is too long for a dynamic uptake study. Therefore, the need for a fat-saturating MR pulse sequence makes it impossible to conduct a comprehensive dynamic MR study of a patient's liver and pancreas.

The invention proceeds from a realization that conventional use of saturation prepulses for water and fat takes up valuable additional time over and above the time required to achieve the desired objective of saturation. Water and fat spins have finite T1's, i.e. take a certain time to recover their original longitudinal magnetization after being nutated by an RF pulse. When saturation prepulses succeed each other too rapidly, the nutated spins have recovered little if any of their original longitudinal magnetization before being subjected to the next saturation. As a result, too-frequently repeated saturation prepulses have little physical effect on the water and fat spins.

SUMMARY OF THE INVENTION

Accordingly, in accordance with the invention, at least one saturation prepulse is used to saturate an entire group of slices of the patient. Then, one line of MR data in each slice of the group is read out without using any other saturation prepulses until after one line of MR data has been read out from each slice in the group. These steps are then repeated, using as many groups as necessary and while progressively changing phase-encoding gradients, until the study has been completed. The result is a much shorter study, with entirely adequate suppression of the undesired signal. Usually, the undesired signal will be the fat signal or the water signal, but this is not required.

For example, if a particular MR study requires that many slices be imaged, then in accordance with the invention the slices are partitioned into more than one group. For example, if an MR liver function study is to be carred out using a particular fat-saturating saturation prepulse that can saturate the volume of interest for long enough to acquire ten slices worth of MR data, the twenty slices of the study may be partitioned into two groups of ten slices each. Then, each time a fat-saturating saturation prepulse is used to saturate the volume of interest, ten lines of MR data are read out, one each for each of the slices in the first group. After the second fat-saturating saturation prepulse saturates the volume of interest once again, ten lines of MR data are likewise read out once again, but this time for each of the slices in the second group. This process may be repeated as often as necessary if additional groups of slices are required, and the entire process is repeated for different phase-encoding gradients until sufficient MR data has been acquired.

There is no requirement that the slices in any group physically adjoin each other or that they be interleaved in any particular manner. There may be only one single saturation prepulse, or there may be an entire sequence of saturation prepulses, spatially-selective or spectrally-selective in any combination. Likewise, there is no requirement that the saturation prepulse(s) be limited to one or two spectral components (e.g. fat and/or water); it is alternatively possible to saturate e.g. three spectral components (fat and silicone and water together, for example).

BRIEF DESCRIPTION OF THE DRAWINGS

The invention will be better understood with reference to the following illustrative and non-limiting drawings, in which.

DETAILED DESCRIPTION OF PREFERRED EMBODIMENTS

Figure 1:
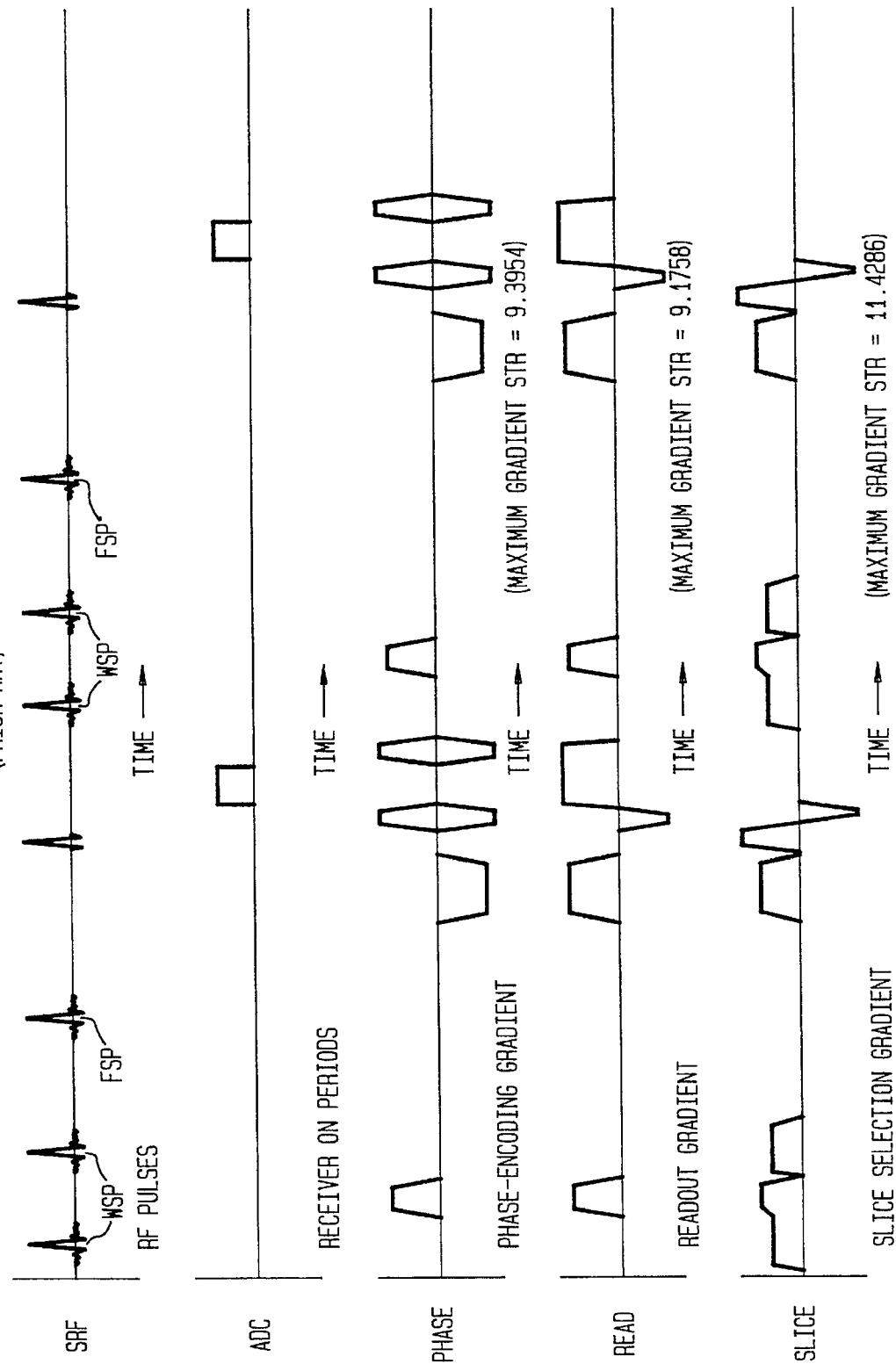
FIG. 1 is a diagram of a known fat and water-suppressed spoiled gradient-echo pulse sequence used to conduct an interleaved multislice study.

FIG. 1 illustrates a known pulse sequence having a minimum TR per line of 6 msec, a TE equalling 2 msec and a bandwidth of 488 Hz/pixel. Two water suppression pulses WSP are used to suppress the water signal in the volumes above and below the particular slices of interest, and these are followed by a fat suppression pulse FSP that suppresses the fat signal. After the fat suppression pulse FSP, an 80° RF pulse is used to cause a line of data to be read out of a single slice. Thus, the pulse sequence illustrated in FIG. 1 causes two lines of data to be read out, with saturation prepulses preceding each line.

Figure 2:
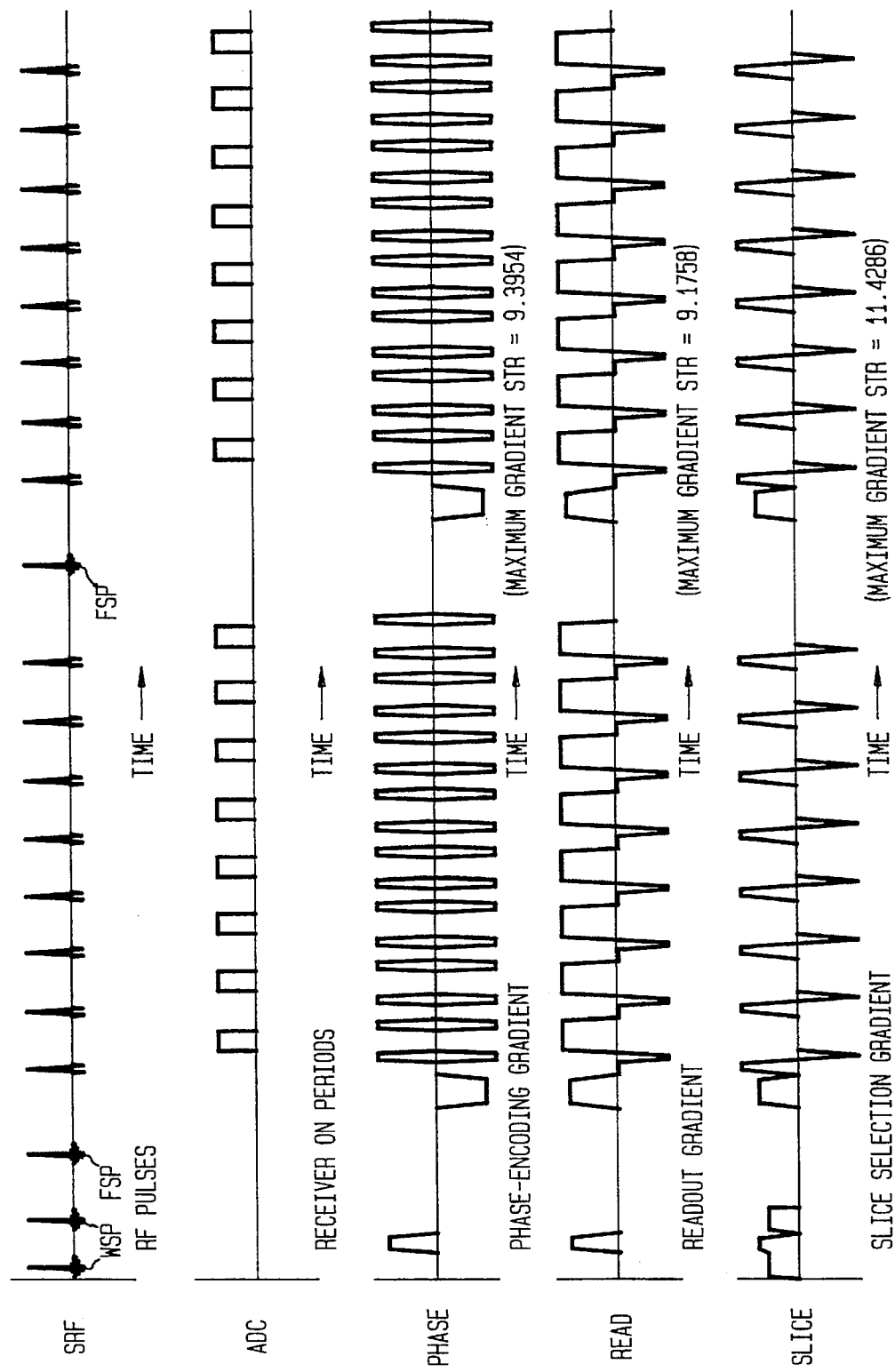
FIG. 2 is a diagram of a preferred embodiment of the invention that suppresses the fat and water signals, that is a spoiled gradient-echo pulse sequence, and that is suitable for conducting an interleaved multislice study.

FIG. 2 illustrates a preferred embodiment of an MR pulse sequence in accordance with the invention. It likewise has a minimum TR per line of 6 msec, a TE of 2 msec and a bandwidth of 488 Hz/pixel, and it is likewise of the interleaved, multislice, spoiled gradient-echo type. So, too, it includes two water suppression pulses WSP and a fat suppression pulse FSP. However, as can be seen from FIG. 2, the water suppression pulses WSP suppress the water signal for sixteen imaging pulses, and the fat suppression pulses FSP suppress the fat signal for eight imaging pulses.

In accordance with the preferred embodiment of the invention as illustrated in FIG. 2, the there-illustrated MR pulse sequence reads out one line of data from each of sixteen slices. Each of the 80° RF pulses reads out a line of data from a single slice. The identity of the slice from which the line of data is read out depends upon the slice selection gradient; in the example illustrated, the multislice study is of the interleaved type and the slices are ordered 1, 3, 5, 7, . . . . 13, 15, 2, 4, 6 . . . 14, 16. However, this is not required; the order could equally well be e.g. 1, 2, 3, . . . 14, 15, 16. After all sixteen lines have been read out, the phase-encoding gradient is changed and sixteen more lines are read out at a different phase-encoding. This is repeated until the entire MR data set has been acquired; typically, such a data set will include data acquired at 120 to 150 phase-encodings.

Although a preferred embodiment has been described above, the scope of the invention is limited only by the following claims:

I claim:

1. A method of rapidly conducting a fat-suppressed or blood-suppressed two-dimensional multislice MR study of a patient, comprising the following steps:

a) using at least one saturation prepulse to saturate all of the slices in a group of slices, thereby suppressing the fat or water signal in all such slices in the group;

b) reading out one line of MR data from each slice in the group, without using any other saturation prepulses until a line of MR data has been read out from each slice in the group; and c) repeating steps a) and b) above until sufficient MR data has been acquired from all slices in the group.

2. The method of claim 1, wherein the study contains more slices than can be fit into one group, and further comprising the steps of partitioning the study into a plurality of groups of slices and acquiring MR data from all slices in all such groups.

3. The method of claim 2, wherein each of the groups has approximately the same number of slices.

4. A method of rapidly conducting a multislice MR study of a patient, in which study the signal from an undesired spectral component has been suppressed, comprising the following steps:

a) using at least one saturation prepulse to saturate all of the slices in a group of slices, thereby suppressing, in all such slices in the group, the signal from the undesired spectral component;

b) reading out one line of MR data from each slice in the group, without using any other saturation prepulses until a line of MR data has been read out from each slice in the group; and c) repeating steps a) and b) above until sufficient MR data has been acquired from all slices in the group.

* * * * *